(12) United States Patent
Nagai et al.

(10) Patent No.: US 9,593,424 B2
(45) Date of Patent: Mar. 14, 2017

(54) SULFURIC ACID RECYCLING TYPE CLEANING SYSTEM AND A SULFURIC ACID RECYCLING TYPE PERSULFURIC ACID SUPPLY APPARATUS

(75) Inventors: Tatsuo Nagai, Tokyo (JP); Norihito Ikemiya, Tokyo (JP); Haruyoshi Yamakawa, Tokyo (JP); Hideki Kobayashi, Tokyo (JP); Hiroshi Morita, Tokyo (JP)

(73) Assignee: KURITA WATER INDUSTRIES, LTD. (JP)

( * ) Notice: Subject to any disclaimer, the term of this patent is extended or adjusted under 35 U.S.C. 154(b) by 910 days.

(21) Appl. No.: 11/663,324

(22) PCT Filed: Sep. 14, 2005

(86) PCT No.: PCT/JP2005/016916
§ 371 (c)(1),
(2), (4) Date: Mar. 19, 2007

(87) PCT Pub. No.: WO2006/030816
PCT Pub. Date: Mar. 23, 2006

(65) Prior Publication Data
US 2008/0251108 A1 Oct. 16, 2008

(30) Foreign Application Priority Data

Sep. 17, 2004 (JP) .................................. 2004-271604
Aug. 11, 2005 (JP) .................................. 2005-232825

(51) Int. Cl.
*C25B 1/28* (2006.01)
*B08B 3/08* (2006.01)
(Continued)

(52) U.S. Cl.
CPC .................. *C25B 1/28* (2013.01); *B08B 3/08* (2013.01); *B08B 3/14* (2013.01); *H01L 21/67057* (2013.01); *C02F 2103/346* (2013.01)

(58) Field of Classification Search
CPC  C25B 1/285; C25B 1/22; C25B 15/08; C25B 1/28; C25F 1/00; C02F 2103/346; B08B 3/08; B08B 3/14; H01L 21/67057
(Continued)

(56) References Cited

U.S. PATENT DOCUMENTS 4,395,312 A * 7/1983 McCreery et al. ........... 205/775
4,615,776 A * 10/1986 Sasaki et al. ................. 205/660
(Continued)

FOREIGN PATENT DOCUMENTS

CN          1113034       12/1995
DE          10219688 A1 * 11/2003 ................ C25F 1/00
(Continued)

OTHER PUBLICATIONS

English Translation of JP7-256260 to Hiroshi; Oct. 1995.*
(Continued)

*Primary Examiner* — Ciel Thomas
(74) *Attorney, Agent, or Firm* — BakerHostetler LLP

(57) ABSTRACT

If incorporated in a cleaning system using persulfuric acid, the invention serves for continuous cleaning while increasing the persulfuric acid concentration adequately to ensure enhanced cleaning performance. The invention provides a feeding apparatus that feeds persulfuric acid to a cleaning apparatus. The cleaning system uses an electrolysis reactor 10 that regenerates the persulfuric acid solution by performing electrolytic reaction to produce persulfate ions from sulfate ions contained in the solution, and a circulation line 4, 5, 6 that circulates the persulfuric acid solution between the cleaning vessel 1 and the electrolysis reactor 10. Con-
(Continued)

figured as above, the invention can provides a feeding apparatus. The cleaning system comprises said configuration and a cleaning vessel 1 that cleans objects 30 using a persulfuric acid solution 2 as cleaning fluid.

17 Claims, 6 Drawing Sheets

(51) Int. Cl.
*B08B 3/14* (2006.01)
*H01L 21/67* (2006.01)
*C02F 103/34* (2006.01)

(58) Field of Classification Search
USPC ............... 204/237, 239; 205/349, 554, 723, 205/766–769, 412, 471, 472
See application file for complete search history.

(56) References Cited

U.S. PATENT DOCUMENTS

| | | | |
|---|---|---|---|
| 4,855,023 A * | 8/1989 | Clark et al. ..................... 134/12 |
| 5,399,247 A * | 3/1995 | Carey et al. ................. 205/688 |
| 5,523,518 A * | 6/1996 | Shikami et al. .............. 205/770 |
| 5,549,798 A * | 8/1996 | Kitajima et al. .............. 204/222 |
| 6,387,238 B1 * | 5/2002 | Merk ..................... A01N 37/16 204/252 |
| 6,562,205 B1 * | 5/2003 | Ban et al. ..................... 204/242 |
| 2002/0108643 A1 | 8/2002 | Yasuda et al. |
| 2003/0077491 A1 * | 4/2003 | Lillis ............................... 429/22 |
| 2003/0221960 A1 * | 12/2003 | Nakao et al. ............ 204/298.09 |
| 2005/0139487 A1 * | 6/2005 | Zwicker et al. ............. 205/701 |

FOREIGN PATENT DOCUMENTS

| | | |
|---|---|---|
| JP | 02-159029 | 6/1990 |
| JP | 03-020746 | 1/1991 |
| JP | 07-256260 | 10/1995 |
| JP | 2000-164550 | 6/2000 |
| JP | 2001-192874 | 7/2001 |
| JP | 2003-511555 | 3/2003 |
| JP | 2004-174485 | 6/2004 |

OTHER PUBLICATIONS

English Translation of JP 7-256260 to Hiroshi Oct. 9, 1995.*
International Preliminary Report on patentability of PCT/JP2005/016916, along with the English translation thereof.

* cited by examiner

F I G. 1
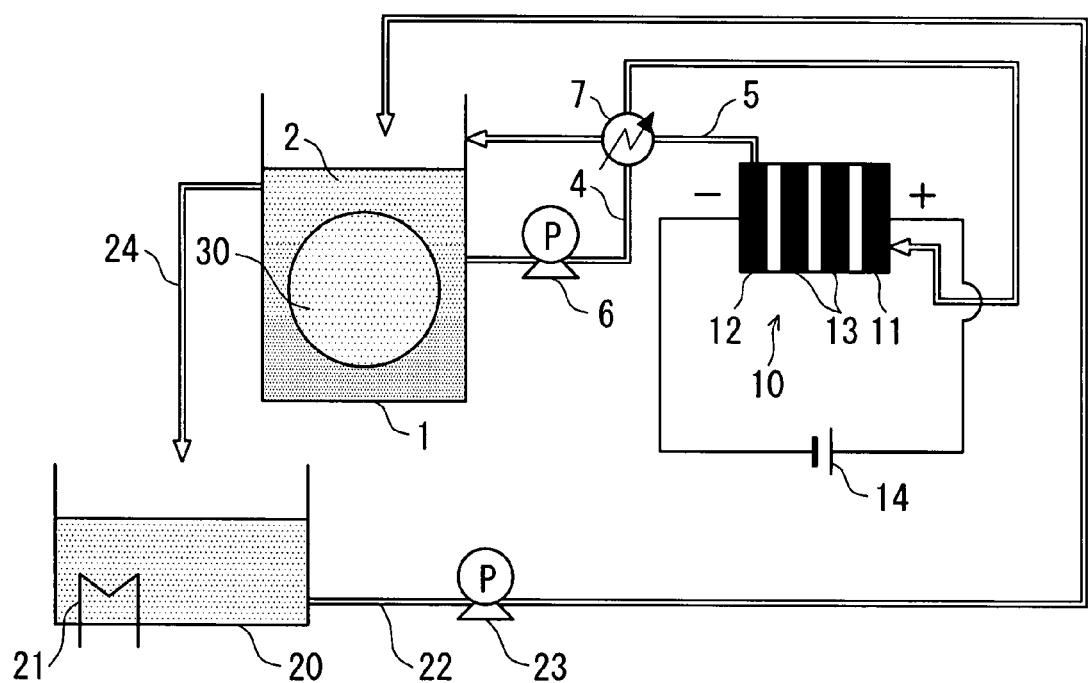

F I G. 3
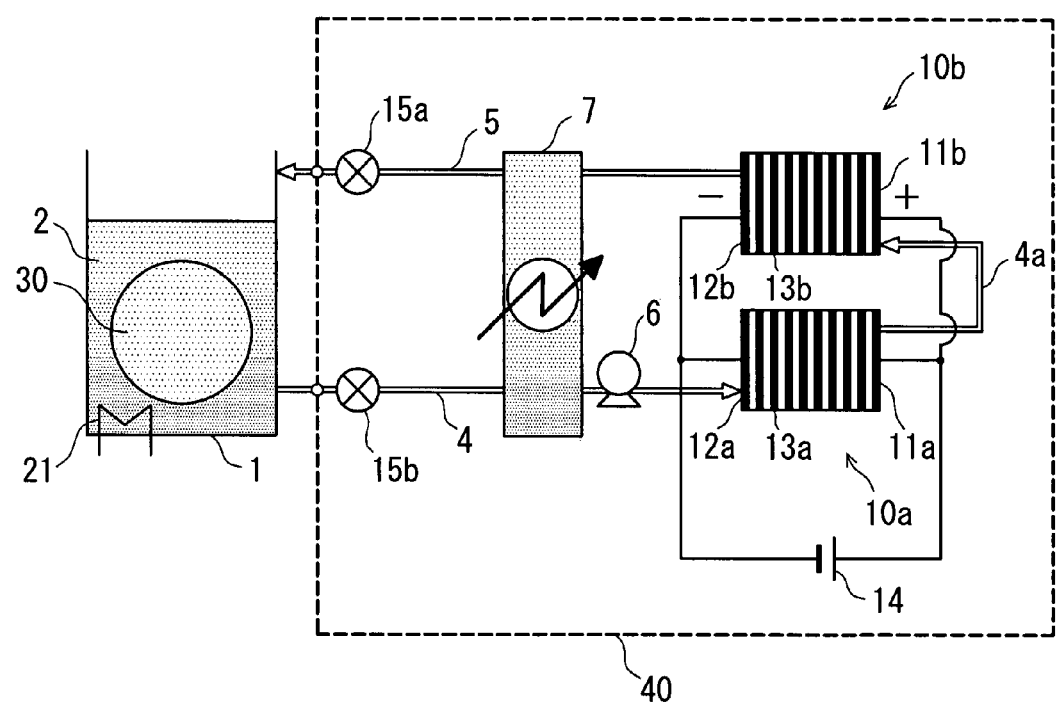

F I G. 4
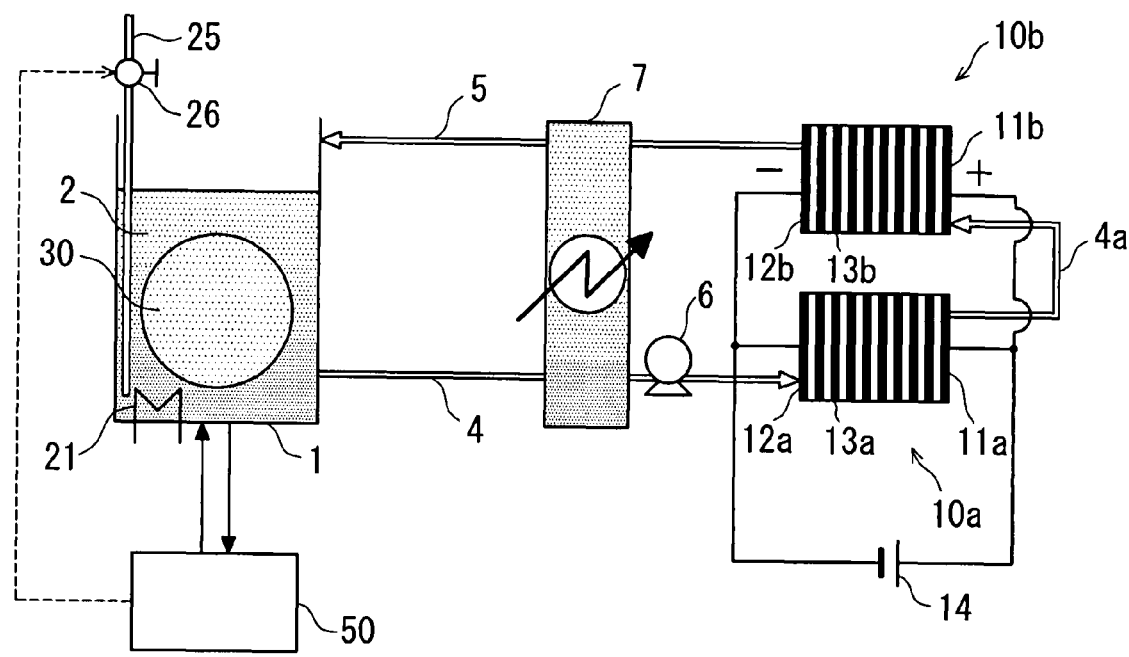

F I G. 5
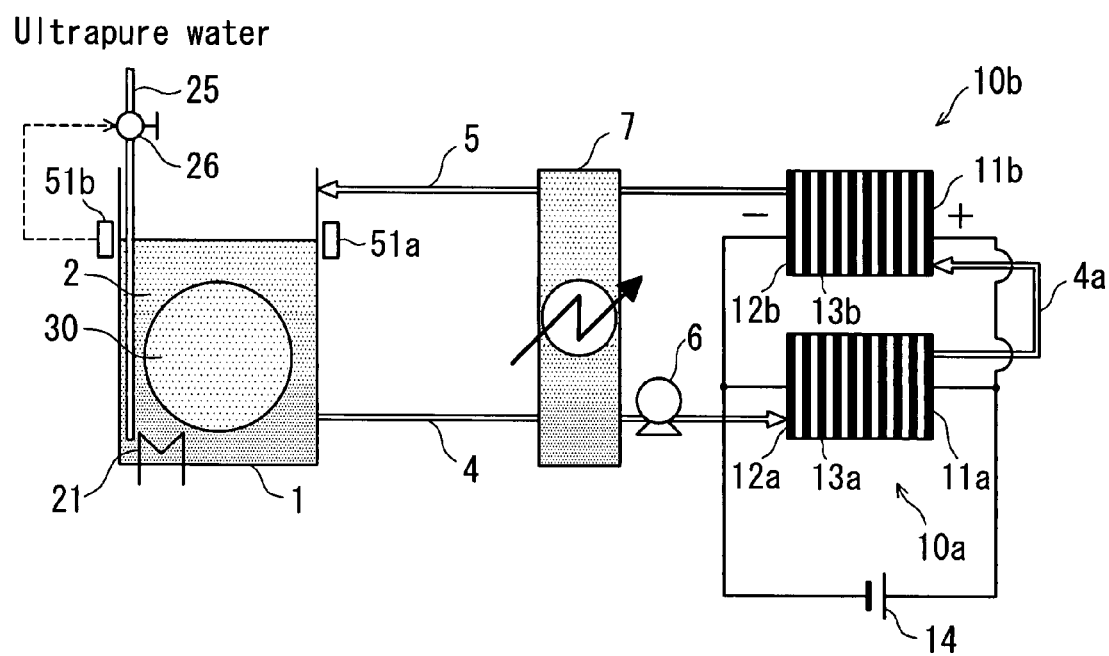

F I G. 6
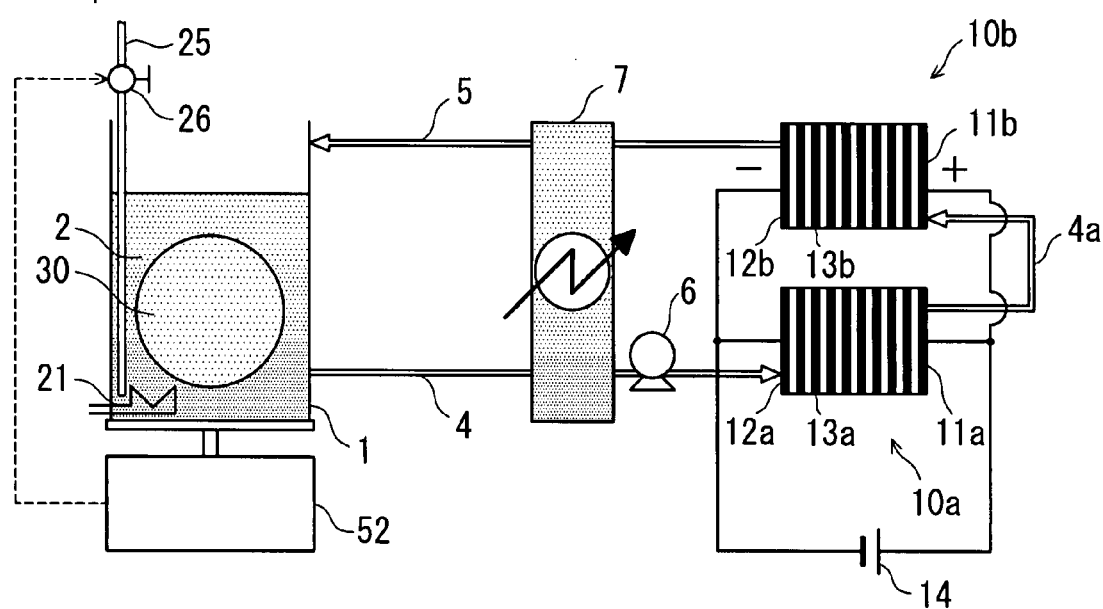

SULFURIC ACID RECYCLING TYPE CLEANING SYSTEM AND A SULFURIC ACID RECYCLING TYPE PERSULFURIC ACID SUPPLY APPARATUS

TECHNICAL FIELD

The present invention relates to a sulfuric acid recycling type cleaning system that uses a sulfuric acid solution repeatedly to regenerate a persulfuric acid solution and supplies it to a cleaning apparatus in which silicon wafers etc. are cleaned to remove contaminants etc. adhering to them by using the persulfuric acid solution which can serve effectively for their removal, and also relates to a sulfuric acid recycling type persulfuric acid supply apparatus that supplies persulfuric acid to said cleaning system.

BACKGROUND ART

The wafer cleaning step in a very large scale integrated circuit (VLSI) production process serves for removal of resist residue, fine particles, metal, oxide films formed spontaneously, etc., and generally uses a mixed solution of concentrated sulfuric acid and hydrogen peroxide (SPM) or a mixed solution produced by blowing ozone into concentrated sulfuric acid (SOM). When hydrogen peroxide or ozone is added to high-concentration sulfuric acid, the sulfuric acid is oxidized to form persulfuric acid. It is known that persulfuric acid shows a high oxidizing power and high cleaning performance as it self-decomposes, and can serve effectively for cleaning wafers etc.

In addition to the above-mentioned persulfuric acid production methods, it is known that a persulfuric acid solution for cleaning can be produced by electrolyzing an aqueous solution containing sulfate ions in an electrolysis reactor (see patent references 1 and 2).

[Patent reference 1] Tokukai (unexamined Japanese patent publication) 2001-192874

[Patent reference 2] Tokuhyo (published Japanese translation of PCT publication for patent application) 2003-511555

DISCLOSURE OF THE INVENTION

Problems to be Solved by the Invention

In the case of SPM, persulfuric acid formed from a hydrogen peroxide solution decreases in oxidizing power as it self-decomposes, and therefore continuous supply of the hydrogen peroxide solution is necessary to compensate for the decomposition. Furthermore, the high-concentration sulfuric acid has to be replaced when the sulfuric acid concentration has decreased to a certain level. In said method, however, the persulfuric acid solution is diluted with the water content of the hydrogen peroxide solution, making it difficult to maintain a constant liquid composition, and furthermore, the solution has to be discarded and replaced at prescribed time intervals or for every few batches. Thus, the cleaning performance cannot be kept constant, and in addition, a large volume of chemicals have to be stored. In the case of SOM, on the other hand, the solution does not undergo dilution, leading to a longer solution replacement cycle, but it is inferior in cleaning performance as compared with SPM.

In the case of SPM, furthermore, only a limited amount of persulfuric acid can be produced when the high-concentration sulfuric acid and the hydrogen peroxide are poured and mixed in the cleaning vessel at the beginning and when hydrogen peroxide is added to the mixture several times later on. In the SOM method, the ratio of the amount of persulfuric acid generated to that of ozone added is very low. With these methods, therefore, the concentration of the resulting persulfuric acid solution is limited, and its cleaning performance is also limited.

The present invention, which was made against such a background, is aimed to provide a sulfuric acid recycling type cleaning system that can largely decrease the sulfuric acid consumption through a persulfate ion recycling process that produces persulfate ions electrochemically from an aqueous sulfuric acid solution while using sulfuric acid repeatedly.

Means for Solving the Problems

Thus, the sulfuric acid recycling type cleaning system of the invention is characterized in that it comprises a cleaning apparatus that cleans objects using a persulfuric acid solution as cleaning fluid, an electrolytic reaction apparatus that regenerates the persulfuric acid solution by performing electrolytic reaction to produce persulfate ions from sulfate ions contained in the solution, and a circulation line that circulates the persulfuric acid solution between the cleaning apparatus and the electrolytic reaction apparatus.

The sulfuric acid recycling type cleaning system of the invention is characterized in that the temperature of the solution that is electrolyzed in said electrolytic reaction apparatus is kept lower than the temperature of said cleaning fluid.

The sulfuric acid recycling type cleaning system of the invention is characterized in that the temperature of the solution that is electrolyzed in said electrolytic reaction apparatus is kept in the range of 10 to 90° C.

The sulfuric acid recycling type cleaning system of the invention is characterized in that the sulfuric acid recycling type cleaning system of the invention comprises a heating means to heat said cleaning fluid.

The sulfuric acid recycling type cleaning system of the invention further comprises a cooling means to cool the solution that is to be electrolyzed in said electrolytic reaction apparatus.

The sulfuric acid recycling type cleaning system of the invention further comprises a cooling means to cool the solution that is to be electrolyzed in said electrolytic reaction apparatus.

The sulfuric acid recycling type cleaning system of the invention further comprises a heat exchange means to perform heat exchange in said circulation line between the comparatively lower temperature feed persulfuric acid solution flowing from said electrolytic reaction apparatus and the comparatively higher temperature return persulfuric acid solution flowing from said cleaning apparatus.

The sulfuric acid recycling type cleaning system of the invention is characterized in that passages in said circulation line are made of quartz or tetrafluoroethylene.

The sulfuric acid recycling type cleaning system of the invention further comprises a decomposition unit that decomposes contaminants removed from objects by said cleaning.

The sulfuric acid recycling type cleaning system of the invention is characterized in that the solution to be electrolyzed in said electrolytic reaction apparatus has a sulfuric acid concentration in the range of 8M to 18M.

The sulfuric acid recycling type cleaning system of the invention is characterized in that of the electrodes in the electrolytic reaction apparatus in the sulfuric acid recycling type cleaning system of the invention, at least an anode is a conductive diamond electrode.

The sulfuric acid recycling type cleaning system of the invention is characterized in that the conductive diamond electrodes provided in the electrolytic reaction apparatus are self-standing type conductive diamond electrodes produced by laminating conductive diamond on a substrate followed by removing the substrate.

The sulfuric acid recycling type cleaning system of the invention is characterized in that the object to be cleaned is a semiconductor substrate.

The sulfuric acid recycling type cleaning system of the invention is characterized in that electrolysis is controlled so that ratio of the rate of TOC (total organic carbon) increase resulting from the removal of organic contaminants in said cleaning apparatus to the rate of persulfuric acid production in said electrolysis apparatus (persulfuric acid production rate (g/L/hr) per TOC increase rate in cleaning vessel (g/L/hr)) is in the range of 10 to 500.

The sulfuric acid recycling type cleaning system of the invention further comprises an ultrapure water or hydrogen peroxide solution replenishment line to supply ultrapure water or a hydrogen peroxide solution to said persulfuric acid solution.

The sulfuric acid recycling type cleaning system of the invention is characterized in that said ultrapure water or hydrogen peroxide solution replenishment line is provided to inject ultrapure water or a hydrogen peroxide solution into the bottom portion of the cleaning vessel in the cleaning apparatus.

The sulfuric acid recycling type cleaning system of the invention further comprises a sulfuric acid concentration measurement means to monitor the sulfuric acid concentration of the solution so that the injection from said ultrapure water or hydrogen peroxide solution replenishment line can be controlled based on concentration measurements taken by said sulfuric acid concentration measurement means.

The sulfuric acid recycling type cleaning system of the invention is characterized in that injection of the ultrapure water or hydrogen peroxide solution from said ultrapure water or hydrogen peroxide solution replenishment line is conducted when the concentration measured by said sulfuric acid concentration measurement means is 0.2M or more higher than a prescribed value.

The sulfuric acid recycling type cleaning system of the invention is characterized in that said sulfuric acid concentration measurement means is designed to use the absorptiometry to measure the sulfuric acid concentration.

The sulfuric acid recycling type cleaning system of the invention further comprises a liquid volume concentration measurement means to monitor the volume of the cleaning fluid in the cleaning vessel in said cleaning apparatus so that the injection action of said ultrapure water or hydrogen peroxide solution replenishment line is controlled based on measurements taken by said liquid volume measurement means.

The sulfuric acid recycling type cleaning system of the invention further comprises a liquid level measurement means to monitor the liquid level of the cleaning fluid in the cleaning vessel in said cleaning apparatus so that the injection action of said ultrapure water or hydrogen peroxide solution replenishment line is controlled based on measurements taken by said liquid level measurement means.

The sulfuric acid recycling type cleaning system of the invention further comprises a liquid weight measurement means to monitor the weight of the cleaning fluid in the cleaning vessel in said cleaning apparatus so that the injection action of said ultrapure water or hydrogen peroxide solution replenishment line is controlled based on measurements taken by said liquid weight measurement means.

The sulfuric acid recycling type cleaning system of the invention is characterized in that said liquid weight measurement means is designed to measure the combined weight of the cleaning vessel and the cleaning fluid in the cleaning vessel.

The sulfuric acid recycling type persulfuric acid supply apparatus of the invention further comprises an electrolytic reaction apparatus that performs electrolytic reaction to regenerate a persulfuric acid solution by producing persulfate ions from sulfate ions contained in the solution, and a circulation line that circulates the persulfuric acid solution between said electrolytic reaction apparatus and a cleaning apparatus that uses persulfuric acid.

The sulfuric acid recycling type persulfuric acid supply apparatus of the invention is characterized in that the sulfuric acid recycling type persulfuric acid supply apparatus of the invention comprises a cooling means to cool the return solution flowing from the cleaning apparatus to the electrolytic reaction apparatus in said circulation line to the range of 10 to 90° C.

The sulfuric acid recycling type persulfuric acid supply apparatus of the invention further comprises a heating means to heat the feed solution flowing from the electrolytic reaction apparatus to the cleaning apparatus in said circulation line to the range of 100 to 170° C.

The sulfuric acid recycling type persulfuric acid supply apparatus of the invention further comprises a heat exchange means to perform heat exchange between the feed solution flowing from the electrolytic reaction apparatus to the cleaning apparatus and the return solution flowing from the cleaning apparatus to the electrolytic reaction apparatus in said circulation line.

The sulfuric acid recycling type persulfuric acid supply apparatus of the invention is characterized in that the sulfate ion concentration of said solution is 8M or more.

The sulfuric acid recycling type persulfuric acid supply apparatus of the invention is characterized in that of the electrodes placed in said electrolytic reaction apparatus in the sulfuric acid recycling type persulfuric acid supply apparatus of the invention, at least an anode is a conductive diamond electrode.

The sulfuric acid recycling type persulfuric acid supply apparatus of the invention is characterized in that passages in said circulation line are made of tetrafluoroethylene.

Thus, according to the present invention, persulfate ions in the cleaning fluid self-decompose to develop an oxidizing power, which in turn serves for effective removal of contaminants from the object being cleaned. In the cleaning fluid, the persulfuric acid concentration gradually decreases as the persulfate ions in the solution continue to self-decompose. This persulfuric acid solution is sent to an electrolytic reaction apparatus through a circulation line. In the electrolytic reaction apparatus, an electric current is applied between an anode and a cathode that are placed in a solution containing sulfate ions in order to oxidize sulfate ions to form persulfate ions, leading to regeneration of a persulfuric acid solution with a sufficiently high persulfuric acid concentration. The regenerated persulfuric acid solution is sent to the cleaning apparatus through the circulation line, followed by effective cleaning of the object with the high-concentration persulfuric acid solution as described above. The persulfuric acid solution is circulated repeatedly between the cleaning apparatus and the electrolytic reaction apparatus to ensure continuous effective cleaning while maintaining a constant persulfuric acid concentration. When the process is started up, sulfuric acid may be used to produce a persulfuric acid solution in the electrolytic reaction apparatus, which is then sent to the cleaning apparatus to start the circulation of the persulfuric acid solution.

Persulfuric acid self-decomposes faster at higher temperatures to show higher cleaning performance. At a high temperature of 130° C., for example, the self-decomposition rate is as high as to achieve a half-value period of about five minutes. In the electrolytic reaction apparatus, on the other hand, persulfuric acid is produced more efficiently and the electrodes suffer less damage at lower solution temperatures. In the present invention, the cleaning apparatus and the electrolytic reaction apparatus are separated from each other, so that the solution electrolyzed in the electrolytic reaction apparatus can be maintained at a lower temperature than the cleaning fluid, serving to increase the efficiencies of the processes in the cleaning apparatus and the electrolytic reaction apparatus.

The cleaning fluid can be maintained at an appropriate temperature by heating with an appropriate means of heating. Such means of heating useful for the present invention include, but not limited to, ordinary heaters and other heating apparatuses that perform heat exchange with hot water or vapor. The appropriate temperature range of the cleaning fluid may be, for example, from 100 to 170° C. The cleaning performance of the persulfuric acid solution deteriorates as the temperature falls below this range. At temperatures above 170° C., on the other hand, persulfuric acid will self-decompose at a very high rate and fail to oxidize the resist sufficiently, so the above temperature range is assumed to be appropriate.

The solution to be electrolyzed in the electrolytic reaction apparatus may be cooled to an appropriate temperature with an appropriate means of cooling. Such means of cooling include, for example, coolers of an air-cooling or a water-cooling type. An appropriate temperature range of the solution being electrolyzed is 10 to 90° C. The efficiency of electrolysis will deteriorate and the electrode damage will be larger as the temperature rises above the range described above. If the temperature falls below the range, on the other hand, very large heat energy will be required to heat the cleaning vessel to a temperature of 130° C., and a very long pipe will be necessary for heat exchange, indicating that this is not practical. For this reason, it is more desirable that the lower limit is 40° C. and upper limit is 80° C., respectively.

Said heating means and cooling means may be provided on the cleaning apparatus or the electrolytic reaction apparatus, or may be provided in the circulation line. Or, a separate line may be provided in the cleaning apparatus or the electrolytic reaction apparatus to perform heating or cooling of the solution.

Temperature adjustment of the solution being electrolyzed and the solution used as cleaning fluid can be achieved by inter heat exchange that is performed as they are sent from either apparatus to the other through the circulation line. If heat exchange is performed between the persulfuric acid solution (return solution) that has a comparatively higher temperature and flows from the cleaning apparatus to the electrolytic reaction apparatus and the persulfuric acid solution (feed solution) that has a comparatively lower temperature and flows from the electrolytic reaction apparatus to the cleaning apparatus, the return solution with a higher temperature will be cooled as it is deprived of heat by the feed solution, and will reach a temperature desirable for electrolysis in the electrolytic reaction apparatus. The feed solution with a lower temperature will be heated through heat exchange, and will be adjusted to a temperature desirable for use as cleaning fluid. Said heat exchange may be performed with an appropriate means of heat exchange such as heat exchanger. The material for passages in the circulation line including the passage for said means of heat exchange should preferably be quartz or tetrafluoroethylene, which are not easily damaged by persulfuric acid.

A means of heating the cleaning fluid and a means of cooling the solution to be electrolyzed may also be provided in addition to said means of heat exchange.

Furthermore, in order to decompose the organic matters including resist that have been dissolved into the persulfuric acid solution as a result of the cleaning, a device for their decomposition may be provided inside or outside the circulation line. Such a device may be, for example, a thermal decomposition apparatus or an electrolytic reaction apparatus.

In the system described above, the solution to be electrolyzed in the electrolytic reaction apparatus contains sulfate ions, and therefore, the efficiency of persulfate ion production in the electrolytic reaction apparatus is largely influenced by the sulfuric acid concentration. Specifically, the efficiency of persulfate ion production increases as the sulfuric acid concentration decreases. If the sulfuric acid concentration is decreased, however, the organic matters including resist will decrease in solubility and become more difficult to remove from the object being cleaned. From this, the sulfuric acid concentration in the solution used for this system should preferably be, for example, in the range of 8M to 18M. For the same reason, the lower limit should more preferably be 12M and upper limit should more preferably be 17M, respectively.

However, the water content in the sulfuric acid solution decreases, though only gradually, as a result of electrolysis. The water content also decreases as a result of evaporation. To replenish for this loss of water, it is desirable to add ultrapure water or a hydrogen peroxide solution as the water content decreases. For addition of said ultrapure water or a hydrogen peroxide solution, a replenishment line may be provided to supply ultrapure water or a hydrogen peroxide solution to said persulfuric acid solution. If water is poured on the surface of the sulfuric acid solution, a large heat will be generated to cause part of the water added to evaporate or scatter at the surface, leading not only to a loss of ultrapure water or the hydrogen peroxide solution but also to danger to the operator. To avoid this, it is preferred that said ultrapure water or hydrogen peroxide solution replenishment line be provided in such a way that said ultrapure water or hydrogen peroxide solution is injected into the bottom part of the cleaning vessel in the cleaning apparatus.

If the operator supplies water carelessly as the water content appears to have decreased significantly, the sulfuric acid concentration may change largely to cause a large change in the performance for removal of resist and other organic matters. So, a means of sulfuric acid concentration measurement may be provided to measure the sulfuric acid concentration of the solution that is circulating through the circulation line to allow said ultrapure water or hydrogen peroxide solution replenishment line to perform injection operation based on concentration measurements taken by said means of sulfuric acid concentration measurement.

Concentration measured may be shown on an appropriate display apparatus to allow the operator to operate the ultrapure water or hydrogen peroxide solution replenishment line based on the measurements displayed, or a control valve etc. may be provided in the ultrapure water or hydrogen peroxide solution replenishment line that is controlled based on the measurements to allow the ultrapure water or hydrogen peroxide solution replenishment line to be operated automatically.

For the present invention, there are no specific limitations on the means of sulfuric acid concentration measurement if it can serve to measure the sulfuric acid concentration properly, but the use of absorptiometry etc. is preferred because it can determine the sulfuric acid concentration quickly.

A preferable sulfuric acid concentration may be prescribed beforehand for the solution so that the measured concentration can be compared with the prescribed concentration in controlling the operation of the ultrapure water or hydrogen peroxide solution replenishment line. In this case, it is preferred that said ultrapure water or hydrogen peroxide solution replenishment line perform the injection of the ultrapure water or hydrogen peroxide solution when the measured concentration becomes 0.2M or more higher than the prescribed concentration. This is because the efficiency of persulfuric acid production in the electrolysis reactor decreases rapidly if the concentration becomes 0.2M or more higher than the optimum value, while influence on the efficiency of persulfuric acid production is small if the difference is less than 0.2M.

Furthermore, the injection operation of the ultrapure water or hydrogen peroxide solution replenishment line may be performed based on the volume of the cleaning fluid in the cleaning vessel in the cleaning apparatus in stead of basing on the sulfuric acid concentration. A decrease in the volume of the cleaning fluid indicates a rise in the sulfuric acid concentration. In the cleaning system, the volume of the solution in the circulation line and the electrolysis reactor stays nearly constant during the cleaning and electrolysis processes, and a change in the volume of the solution will cause a change in the volume of the cleaning fluid in the cleaning vessel. The volume of the cleaning fluid can be determined from the weight or the level of the cleaning fluid in the cleaning vessel. These values may be measured by appropriate means to measure the amount of the fluid to allow the injection operation of the ultrapure water or hydrogen peroxide solution replenishment line to be controlled based on the measurement. Depending on the type of quantity to be measured, said means to measure the amount of the fluid may be a means of liquid level measurement if liquid level measurement is required, or a means of liquid weight measurement if liquid weight measurement is required. Or, the volume of the cleaning fluid can be determined by measuring the volume of the space left in the cleaning vessel.

For the invention, there are no specific limitations on the means to measure the amount of the cleaning fluid if it can serve for the purpose of measurement, and various existing sensors may be used. In performing such measurement, an optimum liquid level or weight may be prescribed so that the prescribed value can be compared with the measurement to allow the ultrapure water or hydrogen peroxide solution replenishment line to perform replenishment operation (on/off switching, injection volume control, etc.) based on the difference value.

In the electrolytic reaction apparatus, electrolysis is performed on a pair of electrodes, i.e. anode and cathode. For the present invention, there are no specific limitations on the material of the electrodes. However, if platinum, a substance widely used as electrode material, is used for the anode in the electrolytic reaction apparatus of the present invention, persulfate ions cannot be produced efficiently and platinum will be dissolved undesirably. Compared with this, a diamond electrode can produce persulfate ions efficiently without suffering significant damage. It is preferred therefore that a diamond electrode be used as the anode which works to produce persulfate ions, and it is more preferred that both the anode and the cathode be diamond electrodes.

A preferred conductive diamond electrode may be a product that is produced by using a base of a semiconductor material such as silicon wafer on which a thin conductive diamond layer is formed, followed by dissolution of the wafer, or a product that is produced by performing precipitation to form a self-standing type plate of polycrystal diamond instead of using a base. A product consisting of a diamond layer formed on a metal substrate such as Nb, W and Ti may be used, but in this type, the diamond layer will peel off more easily as the electric current density increases.

A process for producing persulfate ions from sulfate ions using conductive diamond electrodes has been published (Ch. Comninellis et al., Electrochemical and Solid-State Letters, Vol. 3 (2) 77-79 (2000), Tokuhyo (published Japanese translation of PCT publication for patent application) 2003-511555) for cases where the electric current density is about 0.2 A/cm$^2$. However, in the case of an electrode consisting of a thin diamond layer supported on a metal substrate, the diamond layer can peel off and fail to work in a short period of time. Thus, it is preferred to use self-standing type conductive diamond electrodes that are produced by precipitation on a substrate followed by removal of the substrate.

Said thin layer of conductive diamond is produced by doping a thin diamond layer with a required amount of boron or nitrogen during a diamond synthesis process in order to allow the layer to develop conductivity. Boron-doped layers are used frequently. If the degree of doping is too low, the layer will not have a desired technological advantage, while the effect of doping will level off if the layer is doped excessively. The optimum degree of doping is generally in the range of 50 to 20,000 ppm relative to the amount of carbon in the thin diamond layer.

For the present invention, conductive diamond electrodes in the form of a plate are used in most cases, but a plate having a network structure can also be used. Thus, for the present invention, there are no specific limitations on the number and form of said electrodes.

It is preferred that the electrolysis using said conductive diamond electrodes be performed by applying an electric current with a density in the range of 10 to 100,000 A/m$^2$ to the surface of the conductive diamond electrodes and allowing a solution containing sulfate ions to flow parallel with the diamond electrode surface at a linear velocity of 1 to 10,000 m/hr so that they come in contact with each other.

The cleaning apparatus used may be either of a single disc processing type or of a batch processing type, but soluble TOC substances are dissolved into the cleaning fluid as resist and other contaminants are removed and dissolved during the cleaning of an electronic substrate in said cleaning apparatus. Here, it is necessary to remove the TOC substances efficiently from the cleaning fluid and prevent re-adhesion of organic substances onto the electronic substrate, and therefore the persulfuric acid production rate (g/L/hr) in the electrolytic reaction apparatus should preferably be 10 to 500 times the generation rate (g/L/hr) of the TOC substances that result from removal and dissolution of resist in the cleaning apparatus. This serves to achieve a good balance between the consumption and formation of persulfuric acid, permitting efficient cleaning and efficient electrolysis. For the same reason, the lower limit should preferably be 20 and the upper limit should preferably be 300, respectively.

Advantageous Effect of the Invention

As described above, the sulfuric acid recycling type cleaning system of the invention consists of a cleaning apparatus that performs cleaning by using a persulfuric acid solution as cleaning fluid, an electrolytic reaction apparatus that performs electrolytic reaction to regenerate the persulfuric acid solution by producing persulfate ions from sulfate ions contained in the solution, and a circulation line that circulates the persulfuric acid solution between the cleaning apparatus and the electrolytic reaction apparatus, so that the sulfuric acid solution can be used repeatedly and that the persulfuric acid solution which serves to enhance the removal performance can be regenerated on-site in the electrolytic reaction apparatus and used for cleaning.

Furthermore, the sulfuric acid recycling type persulfuric acid supply apparatus of the invention consists of an electrolytic reaction apparatus that performs electrolytic reaction to regenerate the persulfuric acid solution by producing persulfate ions from the sulfate ions contained in the solution, and a circulation line that circulates the solution between the electrolytic reaction apparatus and the cleaning apparatus that consumes persulfuric acid, so that instead of adding chemicals from outside, the sulfuric acid solution can be used repeatedly to allow the electrolytic reaction apparatus to produce and supply the persulfuric acid solution on-site.

BRIEF DESCRIPTION OF THE DRAWINGS

FIG. 1 a schematic drawing showing a mode of the sulfuric acid recycling type cleaning system of the invention.
FIG. 3 A schematic drawing showing a mode of the sulfuric acid recycling type persulfuric acid supply apparatus of the invention.
FIG. 4 A schematic drawing showing another mode of the sulfuric acid recycling type cleaning system of the invention.
FIG. 5 A schematic drawing showing still another mode.
FIG. 6 A schematic drawing showing still another mode.

Figure 2:
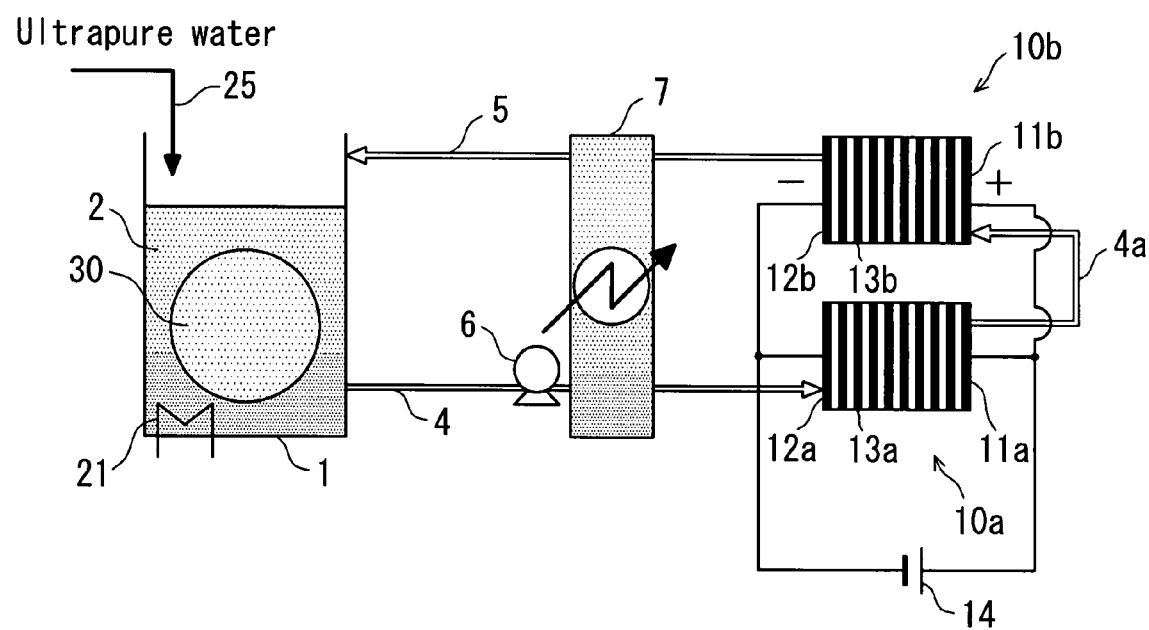
FIG. 2 A schematic drawing showing another mode of the system.

EXPLANATION OF NUMERALS 1 cleaning vessel
2 persulfuric acid solution
4 return pipe
5 feed pipe
6 liquid feed pump
7 heat exchanger
10, 10a and 10b electrolysis reactor
11, 11a and 11b anode
12, 12a and 12b cathode
13 bipolar electrodes
14 DC power supply
20 thermal decomposition reactor
21 heater
25 ultrapure water replenishment line
30 semiconductor wafer
40 sulfuric acid recycling type persulfuric acid supply apparatus
50 sulfuric acid concentration measurement apparatus
51a liquid level sensor
51b liquid level sensor
52 weighing apparatus

BEST MODE FOR CARRYING OUT THE INVENTION

Embodiment 1-1

An embodiment of the sulfuric acid recycling type cleaning system of the invention is explained below based on FIG. 1.

An electrolysis reactor 10 which corresponds to the electrolytic reaction apparatus of the invention is connected through a return pipe 4 and a feed pipe 5 to a cleaning vessel 1 which corresponds to the cleaning apparatus of the invention. In both the return pipe 4 and the feed pipe 5, at least the inner surfaces are made of tetrafluoroethylene, and a liquid feed pump 6 for feeding the persulfuric acid solution 2 is provided in the line of the return pipe 4. The circulation line of the invention comprises said return pipe 4, feed pipe 5, and liquid feed pump 6. A heat exchanger 7 that corresponds to the heat exchange means of the invention is provided between the return pipe 4 and the feed pipe 5, and said heat exchanger 7 serves for heat exchange between the solution flowing in the return pipe 4 and the solution flowing in the feed pipe 5. In the tubes (not shown) within the heat exchanger 7 as well, at least the inner surface is made of tetrafluoroethylene. The use of tetrafluoroethylene, which is resistant to persulfuric acid, as material for the return pipe 4, feed pipe 5, and tubes in the heat exchanger 7 serves to prevent damage from being caused by persulfuric acid. Heat exchange between the solutions is performed between the return pipe 4 and the feed pipe 5 in this embodiment, but for the present invention, the return pipe 4 may be provided with a cooling means that cools the solution preferably down to 10 to 90° C. while the feed pipe 5 may be provided with a heating means that heats the solution preferably up to 100 to 170° C.

An anode 11 and a cathode 12 are provided in said electrolysis reactor 10, and bipolar electrodes 13 . . . 13 are provided at prescribed intervals between the anode 11 and the cathode 12. For the present invention, the electrodes may not be of a bipolar type but may comprise only an anode and a cathode. Said anode 11 and the cathode 12 are connected with a DC power supply 14 to allow the electrolysis reactor 10 to perform direct-current electrolysis.

In this embodiment, said electrodes 11, 12, and 13 comprises diamond electrodes. Said diamond electrodes are produced by producing a thin diamond layer over a substrate and doping it with boron preferably in the range of 50 to 20,000 ppm relative to the amount of carbon in said thin diamond layer. Furthermore, it may be a self-standing type electrode which is produced by removing the substrate after producing the thin layer.

The cleaning vessel 1 is connected with the thermal decomposition reactor 20, which corresponds to the decomposition apparatus of the invention, through circulation pipes for thermal decomposition 22, 24, which are provided separately from said circulation line. A liquid feed pump 23 is provided in the line of the circulation pipe for thermal decomposition 22, and the combination of the circulation pipes for thermal decomposition 22, 24 and the liquid feed pump 23 allows the cleaning fluid to circulate between the cleaning vessel 1 and the thermal decomposition reactor 20. Furthermore, a heater 21 is provided in the thermal decomposition reactor 20 to heat the liquid in the vessel, and said heater 21 also serves as the heating means for the present invention.

The working of a sulfuric acid recycling type cleaning system configured as described above is explained below.

A sulfuric acid solution with a sulfuric acid concentration of 10 to 18M is poured in the cleaning vessel 1 and ultrapure water is added up to a volume ratio of 5:1 to produce a sulfuric acid solution. The solution is sent continuously by the liquid feed pump 6 to the electrolysis reactor 10. In the electrolysis reactor 10, electricity is applied to the anode 11 and the cathode 12 by the DC power supply 14 so that the bipolar electrodes 13 . . . 13 are polarized to allow anodes and cathodes to be formed at prescribed intervals. The solution sent to the electrolysis reactor 10 is allowed to flow between these electrodes. The output of the liquid feed pump 6 should preferably be adjusted so that the linear velocity of the liquid flow is in the range of 1 to 10,000 m/hr. Furthermore, the application of electricity should preferably be adjusted so that the current density at the surface of the diamond electrodes comes in the range of 10 to 100,000 $A/m^2$.

When electricity is applied to the solution in the electrolysis reactor 10, the sulfate ions in the solution is oxidized to form persulfate ions, resulting in the regeneration of the persulfuric acid solution 2. This persulfuric acid solution 2 is sent through the feed pipe 5 to the cleaning vessel 1 to provide the high-concentration persulfuric acid solution 2 in the cleaning vessel 1. In the cleaning vessel 1, in spite of a slight decrease in the concentration of persulfate ions resulting from self-decomposition, the solution circulates between the cleaning vessel 1 and the electrolysis reactor 10 and it is electrolyzed in the electrolysis reactor 10, producing persulfate ions to maintain a high-concentration of persulfate ions. For this practical mode, the process of producing persulfuric acid from sulfuric acid during its start-up period was described previously, but for the invention, persulfuric acid may be procured in advance. However, the use of electrolytic reaction apparatus for persulfuric acid production is advantageous because persulfuric acid can be produced on-site.

Furthermore, the persulfuric acid solution 2 in the cleaning vessel 1 can be heated by circulating the persulfuric acid solution 2 between the cleaning vessel 1 and the thermal decomposition reactor 20 through the circulation pipes for thermal decomposition 22, 24, and liquid feed pump 23, while heating the solution in the thermal decomposition reactor 20 with the heater 21. The circulation through the circulation pipes for thermal decomposition 22, 24, and liquid feed pump 23 may be started after the persulfuric acid concentration in the cleaning vessel 1 has increased up to a required level.

Cleaning of a semiconductor wafer 30, which is the object to be cleaned, is started after the temperature of the persulfuric acid solution 2 that acts as cleaning liquid in the cleaning vessel 1 has been increased by the above-mentioned heating up to about 130° C. Specifically, the semiconductor wafer 30 is immersed in the cleaning vessel 1. In the cleaning vessel 1, strong oxidative conditions have been developed as a result of self-decomposition of persulfate ions and effect of sulfuric acid, and thus, the contaminants etc. on the semiconductor wafer 30 are removed effectively and transferred into the persulfuric acid solution 2. The substances removed and transferred into the persulfuric acid solution 2 are decomposed by the action of persulfate ions. The persulfuric acid in the cleaning vessel 1 is sent to the electrolysis reactor 10 through the return pipe 4 and the liquid feed pump 6, and persulfate ions are produced from sulfate ions as described above, so that the persulfuric acid concentration which has decreased as a result of self-decomposition is increased to regenerate the persulfuric acid solution 2.

As the persulfuric acid solution 2 flows through the return pipe 4 from the cleaning vessel 1 to the electrolysis reactor 10, it undergoes heat exchange in the heat exchanger 7 with the persulfuric acid solution 2 that flows through the feed pipe 5 after being electrolyzed in the electrolysis reactor 10. The persulfuric acid solution 2 flowing out of the cleaning vessel 1 has been heated up to about 130° C. to ensure effective cleaning. The persulfuric acid solution 2 flowing out of the electrolysis reactor 10, on the other hand, has a temperature of about 40° C. During the heat exchange between the two flows of the persulfuric acid solution 2, the persulfuric acid solution 2 flowing through the return pipe 4 is cooled down to a temperature of nearly about 40° C. while the persulfuric acid solution 2 flowing through the feed pipe 5 is heated up to a temperature of nearly about 130° C. After the heat exchange in the heat exchanger 7, the persulfuric acid solution 2 flowing through the return pipe 4 cools naturally afterward and gradually to about 40° C., which is a suitable temperature for electrolytic reaction. If more positive cooling is necessary, a cooling means, for example a water-cooling or air-cooling means, may be provided for forced cooling of the electrolysis reactor 10. After undergoing heat exchange in the heat exchanger 7, the persulfuric acid solution 2 flowing through the feed pipe 5 reaches the cleaning vessel 1, and mixes with the persulfuric acid solution 2 left in the cleaning vessel 1. If the temperature of the persulfuric acid solution 2 in the cleaning vessel 1 becomes too low, it may be heated with the heater 21 up to a temperature suitable for cleaning. As described above, the persulfuric acid solution 2 is cooled as it flows from the cleaning vessel 1 to the electrolysis reactor 10, and after being electrolyzed, it is heated as it flows back from the electrolysis reactor 10 to the cleaning vessel 1. During this cycle, the quantity of heat released from the cooling process is nearly equal to the quantity of heat consumed for the heating process, and therefore, if the efficiency of the heat exchanger 7 is very high, the temperature control of the persulfuric acid solution 2 can be performed very efficiently by supplying a small amount of heat energy from outside to compensate for heat dissipation.

The persulfuric acid solution 2 polluted with contaminants in the cleaning vessel 1 is sent through the circulation pipe for thermal decomposition 24 to the thermal decomposition reactor 20, where it is heated with the heater 21 up to an appropriate temperature (130° C. for example) to ensure that resist and other organic substances will be decomposed to enhance the cleanliness of the persulfuric acid solution 2. This sulfuric acid solution is returned to the electrolysis reactor 10 through the circulation pipe for thermal decomposition 22 and the liquid feed pump 23 so that cleaning will be continued with the persulfuric acid solution 2 that has restored a high cleaning performance.

Thus, if the sulfuric acid recycling type cleaning system is used to clean the semiconductor wafer 30, the persulfuric acid solution 2 can be used repeatedly, without supplying additional hydrogen peroxide solution or ozone, in order to allow effective cleaning to be continued while regenerating the persulfuric acid solution 2.

Embodiment 1-2

Another embodiment of the sulfuric acid recycling type cleaning system of the invention is explained below based on FIG. 2.

For some parts of embodiment 1-2 configured similarly to embodiment 1 described above, the same numerals are used and their explanations are omitted or simplified.

The cleaning vessel 1 is equipped with a heater 21 to heat the persulfuric acid solution 2, and also equipped with an ultrapure water replenishment line 25 to supply ultrapure water to the persulfuric acid solution 2.

The cleaning vessel 1 is connected with electrolysis reactors 10a and 10b, which correspond to said electrolytic reaction apparatus, through a return pipe 4 and a feed pipe 5. A liquid feed pump 6 is provided in the return pipe 4, and a heat exchanger 7 is provided between the return pipe and the feed pipe 5 as in the case of embodiment 1.

The electrolysis reactors 10a and 10b are connected in series, and the return pipe 4 is connected with the electrolysis reactor 10a and the return pipe 5 is connected with the electrolysis reactor 10b.

A connecting pipe 4a is provided between the electrolysis reactor 10a and the electrolysis reactor 10b. Thus, the solution flows through the return pipe 4, electrolysis reactor 10a, connecting pipe 4a, electrolysis reactor 10b, and feed pipe 5 in this order.

An anode 11a and a cathode 12a are provided in the electrolysis reactor 10a, an anode 11b and a cathode 12b provided in the electrolysis reactor 10b, bipolar electrodes 13a . . . 13a provided at prescribed intervals between the anode 11a and the cathode 12a, and bipolar electrodes 13b . . . 13b provided at prescribed intervals between the anode 11b and the cathode 12b. For the present invention, the electrodes used in the electrolysis reactor may not be of a bipolar type but may comprise only an anode and a cathode. For this embodiment, diamond electrodes are used as the electrodes 11a, 11b, 12a, 12b, 13a, and 13b. As in the case of embodiment 1, these diamond electrodes are produced by doping thin diamond layers with boron. The set of the anode 11a and the cathode 12a and the set of the anode 11b and the cathode 12b are connected with a DC power supply 14 in parallel to allow the electrolysis reactors 10a and 10b to perform direct-current electrolysis.

The working of the sulfuric acid recycling type cleaning system described above is explained below.

The cleaning vessel 1 contains a sulfuric acid solution with a sulfuric acid concentration of 8 to 18M and ultrapure water, which are heated with the heater 21 up to about 130° C. The mixing ratio of sulfuric acid and ultrapure water is adjusted appropriately by supplying ultrapure water from the ultrapure water replenishment line 25 while taking transpiration into account. The sulfuric acid solution is sent to the electrolysis reactor 10a by the liquid feed pump 6. In the electrolysis reactor 10a, electricity is applied to the anode 11a and the cathode 12a by the DC power supply 14 so that the bipolar electrodes 13a . . . 13a are polarized. The solution sent to the electrolysis reactor 10a is allowed to flow at linear velocity of 1 to 10,000 m/hr, and electricity is applied so that the current density at the surface of the diamond electrodes comes in the range of 10 to 100,000 A/m$^2$.

As the solution flows in the electrolysis reactor 10a, persulfate ions are produced from sulfate ions, and then the solution is sent to the electrolysis reactor 10b through the connecting pipe 4a. Similarly, persulfate ions are produced from sulfate ions in the electrolysis reactor 10b as well to provide a high-concentration persulfuric acid solution 2. The high-concentration persulfuric acid solution 2 is sent to the cleaning vessel 1 through the feed pipe 5. In the electrolysis reactor 10b as well, the current density at the surface of the diamond electrodes is adjusted in the range of 10 to 100,000 A/m$^2$.

The cleaning vessel 1 now contains the high-concentration persulfuric acid solution 2 that has undergone electrolysis as described above, and a semiconductor wafer 30 is cleaned as in the above-mentioned case to remove resist and other undesired substances effectively from the semiconductor wafer 30. The persulfuric acid solution 2 in the cleaning vessel 1 gradually decreases in persulfuric acid concentration as a result of self-decomposition, but after being sent to the electrolysis reactors 10a and 10b through the return pipe 4 and the liquid feed pump 6, it is regenerated by electrolysis to increase its persulfuric acid concentration. As it flows through the return pipe 4, it undergoes heat exchange in the heat exchanger 7 with the persulfuric acid solution 2 flowing through the feed pipe 5 after being electrolyzed in the electrolysis reactor 10b. As a result of heat exchange, the persulfuric acid solution 2 flowing through the return pipe 4 is cooled down to a temperature of several tens of degrees C. slightly above 40° C., while the persulfuric acid solution 2 flowing through the feed pipe 5 is heated up to a temperature of a hundred and several tens of degrees C. slightly below 130° C. After this, the persulfuric acid solution 2 flowing through the return pipe 4 cools naturally down to about 40° C., a temperature suitable for electrolytic reaction. The persulfuric acid solution 2 flowing through the feed pipe 5 is sent to the cleaning vessel 1, and subsequently it is heated with the heater 21 up to a temperature suitable for cleaning.

In this embodiment as well, the sulfuric acid solution is used repeatedly to regenerate the persulfuric acid solution 2 to allow effective cleaning to be continued.

Embodiment 2

An embodiment of the sulfuric acid recycling type persulfuric acid supply apparatus of the invention is explained below based on FIG. 3.

For some parts of this embodiment configured similarly to the embodiment described above, the same numerals are used and their explanations are simplified.

A return pipe 4 in which at least the inner surface is made of tetrafluoroethylene is connected to the electrolysis reactor 10a, while a feed pipe 5 in which the inner surface is similarly made of tetrafluoroethylene is connected to the electrolysis reactor 10b. A liquid feed pump 6 for sending the persulfuric acid solution 2 is provided in the line of the return pipe 4, and a heat exchanger 7 is provided between the return pipe 4 and the feed pipe 5. The circulation line of the present invention comprises the return pipe 4, feed pipe 5, and liquid feed pump 6 in this embodiment.

A connecting pipe 4a is provided to connect the electrolysis reactor 10a to the electrolysis reactor 10b, and the solution flows through the return pipe 4, electrolysis reactor 10a, connecting pipe 4a, electrolysis reactor 10b, and feed pipe 5 in this order.

An anode 11a and a cathode 12a are provided in the electrolysis reactor 10a, an anode 11b and a cathode 12b provided in the electrolysis reactor 10b, bipolar electrodes 13a . . . 13a provided at prescribed intervals between the anode 11a and the cathode 12a, and bipolar electrodes 13b . . . 13b provided at prescribed intervals between the anode 11b and the cathode 12b. These electrodes 11a, 11b, 12a, 12b, 13a, and 13b are made of diamond electrodes.

On-off valves 15a and 15b are provided near the end of the return pipe 4 and the feed pipe 5, respectively, in the circulation line to configure the sulfuric acid recycling type persulfuric acid supply apparatus 40 for the invention so that the persulfuric acid solution can be sent to the cleaning apparatus through the feed pipe 5 that is equipped with the on-off valve 15a, while the sulfuric acid solution is returned from the cleaning apparatus through the return pipe that is equipped with the on-off valve 15b, in order to allow the persulfuric acid to be regenerated in the electrolysis reactors 10a and 10b. Here, the linear velocity of the liquid flow and the electric current density are set appropriately as in the embodiments described above.

The ends of the on-off valves 15a and 15b are connected to the cleaning vessel 1 to allow the persulfuric acid solution regenerated in the electrolysis reactors 10a and 10b to be used for cleaning. The circulation line can be detachable from the cleaning vessel 1 to allow the persulfuric acid solution to be sent to other cleaning apparatuses, and a change-over valve may be provided to allow persulfuric acid to be fed to two or more cleaning apparatuses.

As in the case of the sulfuric acid recycling type cleaning system described in the above-mentioned mode, the sulfuric acid recycling type persulfuric acid supply apparatus 40 can send the solution to and receive it from the cleaning vessel 1 to serve for cleaning of the semiconductor wafer 30.

Embodiment 3-1

Another embodiment of the sulfuric acid recycling type cleaning system of the invention is explained below.

For some parts of this mode configured similarly to the modes described above, the same numerals are used and their explanations are omitted or simplified.

Electrolysis reactors 10a and 10b are connected in series by a connecting pipe 4a, and a return pipe 4 is connected with an electrolysis reactor 10a and a feed pipe 5 is connected with an electrolysis reactor 10b. A liquid feed pump 6 is provided in the return pipe 4, and a heat exchanger 7 is provided between the return pipe 4 and the feed pipe 5.

An anode 11a, cathode 12a, and bipolar electrodes 13a . . . 13a that are made of diamond are provided in the electrolysis reactor 10a, and similarly, an anode 11b, cathode 12b, and bipolar electrodes 13b . . . 13b that are made of diamond are provided in the electrolysis reactor 10b.

The cleaning vessel 1 to which the return pipe 4 and the feed pipe 5 are connected is equipped with a sulfuric acid concentration measurement apparatus 50, which works as said sulfuric acid concentration measurement means, in which part of the cleaning fluid in the cleaning vessel 1 is circulated to allow the sulfuric acid concentration of the cleaning fluid to be measured. The sulfuric acid concentration measurement apparatus 50 is configured to measure the sulfuric acid concentration by absorptiometry, for which known apparatuses can be used. On the other hand, an ultrapure water replenishment line 25 is connected to the cleaning vessel 1, and an on-off electromagnetic valve 26 is connected to the ultrapure water replenishment line 25. The opening and closing motion of the on-off electromagnetic valve 26 can be controlled by the sulfuric acid concentration measurement apparatus 50. For the sulfuric acid concentration measurement apparatus 50, a sulfuric acid concentration to be maintained in the cleaning vessel 1 is preset as a standard value, with the standard value being stored in a storage means such as memory device and read out as required.

The working of a sulfuric acid recycling type cleaning system configured as described above is explained below.

In this embodiment, as well as in the embodiment described above, the cleaning vessel 1 contains sulfuric acid, and ultrapure water is added to adjust the sulfuric acid concentration to an appropriate value in the concentration range of 8 to 18M and heated with an appropriate heater 21 up to about 130° C. Here, a sulfuric acid concentration to be maintained is preset as a standard value in the sulfuric acid concentration measurement apparatus 50, with the electromagnetic on-off valve 26 being closed when cleaning is started.

The sulfuric acid solution is sent to the electrolysis reactor 10a by the liquid feed pump 6. In the electrolysis reactor 10a, persulfate ions are produced from sulfate ions that are contained in the solution, and the solution is then sent through the connecting pipe 4a to the electrolysis reactor 10b where persulfate ions are produced from sulfate ions as in the above case to produce a high-concentration persulfuric acid solution 2. Here, the linear velocity of the liquid flow and the electric current density are set appropriately as in the modes described above.

The cleaning vessel 1 contains a high-concentration persulfuric acid solution 2 which is used for cleaning of a semiconductor wafer 30 to remove resist etc. from the semiconductor wafer 30. The persulfuric acid solution 2 in the cleaning vessel 1 gradually decreases in persulfuric acid concentration as a result of self-decomposition, but after being sent to the electrolysis reactors 10a and 10b through the return pipe 4 and the liquid feed pump 6, persulfate ions are regenerated by electrolysis. In this mode as well, the sulfuric acid solution can be used repeatedly in order to allow effective cleaning to be continued while regenerating the persulfuric acid solution 2.

The solution gradually increases in sulfuric acid concentration as a result of electrolysis and evaporation of water as it circulates through the cleaning vessel 1 and the electrolysis reactors 10a and 10b. The sulfuric acid concentration of the solution is measured continuously or at appropriate intervals with the sulfuric acid concentration measurement apparatus 50. Furthermore, the sulfuric acid concentration measurement apparatus 50 compares the measured concentration with the preset value, and opens the electromagnetic on-off valve 26 if the measured concentration is 0.2M or more higher than the preset value to allow ultrapure water to be injected to the cleaning vessel 1 from the ultrapure water replenishment line 25. The quantity to be injected may be preset in advance, or the sulfuric acid concentration measurement apparatus 50 may be designed to monitor the sulfuric acid concentration to maintain the injection until the difference between the measured concentration and the preset value becomes less than 0.2M. After the injection, the electromagnetic on-off valve 26 is closed through the control by the sulfuric acid concentration measurement apparatus 50. Said control serves to maintain the sulfuric acid concentration of the solution appropriately and automatically, allowing the regeneration of persulfate ions to be performed efficiently by the electrolysis reactors 10a and 10b.

Embodiment 3-2

In embodiment 3-1 described above, the sulfuric acid concentration of the solution is monitored for control of the injection of ultrapure water into the solution to maintain an appropriate sulfuric acid concentration of the solution, but instead, the volume of the solution may be monitored for estimation of the sulfuric acid concentration of the solution to control the injection of ultrapure water into the solution.

In this embodiment, the volume of the solution is monitored by measuring the liquid level of the solution in the cleaning vessel 1 before being sent to the cleaning apparatus. This embodiment is explained below. For some parts of this embodiment configured similarly to the embodiment described above, the same numerals are used and their explanations are omitted or simplified.

In the cleaning vessel 1, liquid level sensors 51a and 51b, which work as said liquid level measurement means, are provided near the liquid level in order to monitor the level of the persulfuric acid solution 2 contained in the cleaning vessel 1. In the case of the liquid level sensors 51a and 51b, the liquid level sensor 51b, for example, receives light emitted by the liquid level sensor 51a, and the liquid level is determined as the lower limit of the range where light can reach.

There are no specific limitations on the structure of the liquid level measurement means for the invention, and a floating-type sensor may be used to monitor the liquid level. However, the persulfuric acid solution 2 has a strong oxidizing power, and therefore, a non-contact type sensor, which does not come in contact with the solution, is preferred. In the controller (not shown) which receives output from the liquid level sensor 51b, a liquid level to be maintained may be preset in advance to allow the sulfuric acid concentration of the solution to be maintained appropriately based on the liquid level monitored. The controller can control the opening and closing motion of the electromagnetic on-off valve 26 based on the liquid level monitored.

During the cleaning with the persulfuric acid solution, the liquid level in the cleaning vessel 1 is monitored continuously or at appropriate intervals with the liquid level sensors 51a and 51b. The controller receives output from the liquid level sensor 51b, compares the measured liquid level and the preset liquid level, and if the measured liquid level is lower by a prescribed quantity than the preset value, controls the electromagnetic on-off valve 26 so that ultrapure water is injected to the cleaning vessel 1 from the ultrapure water replenishment line 25. The preset value for triggering the control of the electromagnetic on-off valve 26 by the liquid level sensor 51b may be set up discretionarily and therefore may be zero. The preset value may also be the variation in the liquid level that is equivalent to an increase of 0.2M in the concentration of the solution that takes place as the water content decreases to lower the level from the required height. A prescribed volume of ultrapure water may be injected at a time, or the liquid level may be monitored with the liquid level sensors 51a and 51b to allow injection to be continued until the difference between the measured and the preset liquid level becomes less than a prescribed value. Through this control, the sulfuric acid concentration of the solution is maintained at an appropriate value, and the regeneration of persulfate ions is performed efficiently in the electrolysis reactors 10a and 10b.

Embodiment 3-3

In embodiment 3-2 described above, the volume of the solution is monitored based on the liquid level in the cleaning vessel so that the injection of ultrapure water into the solution is controlled to maintain an appropriate sulfuric acid concentration of the solution, but instead, the weight of the solution in the cleaning vessel may be monitored so that the sulfuric acid concentration of the solution is estimated to allow the injection of ultrapure water into the solution is controlled. Such an embodiment is explained below.

For some parts of this embodiment configured similarly to the embodiment described above, the same numerals are used and their explanations are omitted or simplified.

The cleaning vessel 1 is placed on top of the weighing apparatus 52, which serves a said liquid weight measurement means, so that the change in the weight of the liquid contained in the cleaning vessel 1 can be measured with the weighing apparatus 52. The liquid weight equivalent to the required sulfuric acid concentration is prescribed in the weighing apparatus 52. Whether the sulfuric acid concentration of the solution is maintained at an appropriate value is determined from the weight measurement. Furthermore, the weighing apparatus 52 also serves to control the opening and closing motion of the electromagnetic on-off valve 26, so that if the weight measured with the weighing apparatus 52 differs by a prescribed quantity from the prescribed value, the electromagnetic on-off valve 26 is controlled to allow the ultrapure water is injected to the cleaning vessel 1 from the ultrapure water replenishment line 25. The prescribed quantity may be set up discretionarily and therefore may be zero. The preset value may also be the variation in the liquid weight that is equivalent to an increase of 0.2M in the concentration of the solution that takes place as the water content decreases to reduce the weight from the required value.

During the cleaning with the persulfuric acid solution, the weight of the cleaning vessel 1 is monitored continuously or at appropriate intervals with the weighing apparatus 52. The weight of the body of the cleaning vessel 1 is constant, and therefore, the change in the measurement taken by the weighing apparatus 52 indicates the change in the weight of the solution in the cleaning vessel 1. The weighing apparatus 52 compares the measured and the prescribed weight, and if the measured weight is lower by more than a prescribed quantity, the electromagnetic on-off valve 26 is controlled to allow ultrapure water is injected to the cleaning vessel 1 from the ultrapure water replenishment line 25. For control of the injection of ultrapure water, the quantity to be injected may be preset in advance, or the weighing apparatus 52 may be designed to monitor the weight to maintain the injection until the measured weight becomes equal to a prescribed value. This control allows the sulfuric acid concentration of the solution to be maintained at an appropriate value.

For embodiment 3-1 to 3-3 described above, the ultrapure water replenishment line is provided to supply ultrapure water into the persulfuric acid solution as required, but for the present invention, a replenishment line that supplies hydrogen peroxide solution instead of ultrapure water may be provided to perform similar operations as in the modes described above. Furthermore, both an ultrapure water replenishment line and a hydrogen peroxide solution replenishment line may be provided and allowed to perform similar operations.

Example 1

An example of the invention is described below.

A sulfuric acid recycling type cleaning system as shown in FIG. 1 was used to perform cleaning under the following conditions. Circulated solution:high-concentration sulfuric acid solution (volume ratio of sulfuric acid to ultrapure water=5:1), volume of solution: 50 L Electrolysis Reactor Conductive diamond electrodes (5,000 ppm boron doped), anode area: 40 $dm^2$ Electrolysis Condition Current density: 3000 $A/m^2$, solution temperature: 40° C., flow velocity: 10 m/hr Cleaning Vessel Persulfuric acid concentration: 3 g/L, temperature: 130° C.

Wafer Cleaning Capacity 300 of 5-inch wafers/hr

Cleaning was carried out using the system described above, and results showed that the required frequency of sulfuric acid replacement was decreased to one third, namely from 150 L/day in prior art to 50 L/day, and that addition of hydrogen peroxide was not necessary.

Example 1-2

A sulfuric acid recycling type cleaning system as shown in FIG. 2 was used to perform cleaning under the following conditions. A high-concentration sulfuric acid solution prepared by mixing 40 L of 98% concentrated sulfuric acid and 10 L of ultrapure water was poured in a cleaning vessel and maintained at 130° C. In the electrolysis reactor, two cells connected in series were placed, each cell containing 10 electrodes, and each electrode comprising boron-doped (boron doping: 5,000 ppm) conductive diamond supported on a Si substrate with a diameter of 15 cm and thickness of 1 mm. The total effective electrolysis area was 30 $dm^2$ and the current density was 3,000 $A/m^2$, and the electrolysis was conducted at 40° C. From the analysis of a sample of the solution flowing out from the outlet of the electrolysis reactor, it was shown that the persulfuric acid production rate was 3 g/L/hr. For one immersion cycle, 50 five-inch silicon wafers coated with resist were immersed for 10 minutes in the cleaning vessel to perform dissolution of resist (TOC increase rate: 0.06 g/L/hr). The resultant solution was circulated with a liquid feed pump between the cleaning vessel and the electrolysis reactors at a flow rate of 1 L/min (linear velocity of liquid flow: 80 m/hr). When the resist-coated silicon wafers was immersed, the solution in the cleaning vessel became brown and the TOC concentration was 30 mg/L at first, but after nearly 10 minutes of circulation, the solution in the cleaning vessel became colorless and transparent with the TOC concentration below the detection limit. Such wafer cleaning was conducted for 8 hours (cleaning 2,400 wafers), and results showed that the high-concentration sulfuric acid solution served effectively for resist removal and that the TOC concentration decreased below the detection limit. Wafer cleaning was continued further for 32 hours (cleaning 9,600 wafers, totaling 12,000 wafers), and results again showed that the high-concentration sulfuric acid solution served effectively for resist removal and that the TOC concentration decreased below the detection limit.

Comparative Example 1

A solution prepared by adding 10 L of a 35% hydrogen peroxide solution to 40 L of a 98% concentrated sulfuric acid was poured in a cleaning vessel was maintained at 130° C. According to the same immersion cycle as in Example 1-2, resist-coated wafers were immersed in this solution for dissolution of resist. In the first 6 cycles (cleaning 300 wafers), the solution became brown immediately after the start of immersion, but it became colorless and transparent in nearly 10 minutes, and the TOC concentration reached the detection limit. For the next set of 50 wafers, however, the solution remained brown, and the TOC concentration was still 30 mg/L in 10 minutes after the start of immersion. Then, 10 L of the solution was taken out from the cleaning vessel and 10 L of a hydrogen peroxide solution was added, followed by maintaining the resultant solution at 130° C. In the first 2 cycles (cleaning 100 wafers), the solution becomes brown immediately after the start of immersion, but it becomes colorless and transparent in nearly 10 minutes, and the TOC concentration reaches the detection limit. For the next set of 50 wafers, however, the solution remained brown, and the TOC concentration was still 30 mg/L in 10 minutes after the start of immersion. Then again, 10 L of the solution was taken out from the cleaning vessel and 10 L of a hydrogen peroxide solution was added. The wafer immersion test was continued, but when 50 wafers were immersed, the solution failed to remove the resist effectively, leaving some resist on the wafers after 10 minutes. Replacement of the entire solution became necessary when cleaning of a total of 400 wafers was finished.

Example 1-3

Cleaning test was performed under the same test conditions as in Example 1-2 except that the temperature of the persulfuric acid solution in the cleaning vessel was varied. Other test conditions were the same as in Example 1-2.

Results showed that when cleaning was performed with a cleaning fluid heated at 90° C., the rate of resist removal from wafers was low in the first cycle, and resist was left on the wafers, indicating that cleaning was not achieved satisfactorily. When cleaning was performed with a cleaning fluid heated at 130° C. (Example 1-2), on the other hand, the resist removal rate was high, and the persulfuric acid production rate was also sufficiently high (3 g/L/hr) as compared with the TOC increase rate (0.06 g/L/hr), indicating that cleaning was achieved effectively. In another cleaning test where a cleaning fluid was heated at 180° C., the persulfuric acid production rate was sufficiently high (3 g/L/hr) in the first cycle as compared with the TOC increase rate (0.06 g/L/hr), but the persulfuric acid in the cleaning vessel self-decomposed rapidly, and the amount of the remaining persulfuric acid was not sufficiently large for complete removal of TOC substances, leaving 30 mg/L of TOC substances in the solution. This clearly indicates that the temperature of the cleaning fluid should preferably be in the range of 100° C. to 170° C.

Example 1-4

Then, cleaning test was performed under the same test conditions as in Example 1-2 except that the temperature of the solution in the electrolysis reactor was varied. Other test conditions were the same as in Example 1-2.

Results showed that when the temperature of the solution in the electrolysis reactor was 5° C., the persulfuric acid production rate was 4.5 g/L/hr, and a sufficient volume of persulfuric acid was maintained as compared with the TOC increase rate of 0.06 g/L/hr, but since the temperature of the cleaning fluid was 130° C., heating was necessary to increase the temperature of the solution by 125° C., which required long pipes for circulation as well as a large input of heat energy. Thus, a large portion of the persulfuric acid was consumed before reaching the cleaning vessel, and 30 mg/L of TOC substances were left in the solution at the end of the first cycle. Compared with this, when the temperature of the solution in the electrolysis reactor was 10° C., 40° C., 80° C., or 90° C., the persulfuric acid production rate was 4 g/L/hr, 3 g/L/hr, 1.2 g/L/hr, or 0.9 g/L/hr, respectively, suggesting that persulfate ions were produced efficiently. The electrodes were free of damage after 1,000 hours of electrolysis. When the temperature of the solution in the electrolysis reactor was 100° C., on the other hand, the persulfuric acid production rate was 0.25 g/L/hr, clearly showing that the persulfate ion production rate deteriorated. Thus, the ratio of (persulfuric acid production rate (g/L/hr)/TOC increase rate (g/L/hr)) was less than 10, and oxidative decomposition did not proceed satisfactorily.

Furthermore, 500 hours of electrolytic reaction resulted in exfoliation of the conductive diamond layer from the Si substrate. Thus, it was clearly shown that the temperature of the solution used for the electrolytic reaction should preferably be in the range of 10 to 90° C.

Example 1-5

Then, cleaning test was performed under the same test conditions as in Example 1-2 except that the current density in the electrolysis reactor was varied to change the persulfuric acid production rate. Other test conditions were the same as in Example 1-2.

As a result, a sufficiently high persulfuric acid production rate as compared with the TOC increase rate was obtained and effective cleaning was achieved when the current density was in the range of 10 to 100,000 A/m² as shown in Table 1.

TABLE 1

Result of examination varied current density

| Run No. | current density (A/m²) | persulfuric ions production rate [g/l/hr] | TOC increase rate [g/l/hr] | persulfuric acid/ TOC | TOC concentration in a solution (mg/l) | cleaning effect for wafers |
|---|---|---|---|---|---|---|
| 1 | 7.5 | 0.1 | 0.06 | 1.7 | 30 mg/l | X |
| 2 | 3000 | 3.0 | 0.06 | 50 | <5 mg/l | ○ |
| 3 | 5000 | 4.8 | 0.06 | 80 | <5 mg/l | ○ |
| 4 | 7500 | 6.5 | 0.06 | 108 | <5 mg/l | ○ |
| 5 | 10000 | 9.0 | 0.06 | 150 | <5 mg/l | ○ |
| 6 | 120000 | electrode broken | 0.06 | electrode broken | 30 mg/l | X | persulfuric acid/TOC: persulfuric ions production rate/TOC increase rate

Example 1-6

Cleaning test was performed under the same test conditions as in Example 1-2 except that the persulfuric acid production rate was varied by changing the linear velocity of the liquid flow in the electrolysis reactor. Other test conditions were the same as in Example 1-2.

Results are shown in Table 2. When the linear velocity of the liquid flow was 0.3 m/hr, many air bubbles were formed in the electrolysis cells, making it impossible to perform the electrolysis reaction. For a linear velocity of 20,000 m/hr, on the other hand, a very long tube would be required for heat exchange, making it impossible to design a practical system. A sufficiently high persulfuric acid production rate, relative to the TOC increase rate, and a satisfactory cleaning performance were achieved when the linear velocity was in the range of 1 to 10,000 m/hr.

Example 2

A high-concentration sulfuric acid solution prepared by mixing 40 L of 98% concentrated sulfuric acid and 8 L of ultrapure water was poured in a cleaning vessel and maintained at 130° C. As shown in FIG. 3, in the electrolysis reactor, two cells connected in series were placed, each cell containing 10 electrodes, and each electrode comprising boron-doped conductive diamond supported on a Si substrate with a diameter of 15 cm and thickness of 1 mm. The effective anode area and the current density were 30 dm² and 30 A/dm², respectively, and the electrolysis was conducted at 40° C. From the analysis of a sample of the solution flowing out from the outlet of the electrolysis reactor, it was shown that the persulfate ions production rate was 3 g/L/hr.

For one immersion cycle, 50 six-inch silicon wafers coated with resist were immersed for 10 minutes in the cleaning vessel to perform dissolution of resist (TOC increase rate: 0.04 g/L/hr). The resultant solution was circulated with a pump between the cleaning vessel and the electrolysis reactors at a flow rate of 1 L/min.

When the resist-coated silicon wafers was immersed, the solution in the cleaning vessel became brown and the TOC concentration was 30 mg/L at first, but after nearly 10 minutes of circulation, the solution in the cleaning vessel became colorless and transparent with the TOC concentration below the detection limit. Such wafer cleaning was conducted for 8 hours (cleaning 2,400 wafers), and results showed that the high-concentration sulfuric acid solution served effectively for resist removal and that the TOC concentration decreased below the detection limit. Wafer cleaning was continued further for 32 hours (cleaning 9,600

TABLE 2

| Run No. | linear velocity (m/hr) | persulfuric ions production rate [g/l/hr] | TOC increase rate [g/l/hr] | persulfuric acid/ TOC | TOC concentration in a solution (mg/l) | cleaning effect for wafers |
|---|---|---|---|---|---|---|
| 1 | 0.3 | electrolytic reaction is disable | 0.06 | — | 30 mg/l | X |
| 2 | 5 | 3.0 | 0.06 | 50 | <5 mg/l | ○ |
| 3 | 40 | 3.2 | 0.06 | 53 | <5 mg/l | ○ |
| 4 | 300 | 3.3 | 0.06 | 55 | <5 mg/l | ○ |
| 5 | 5000 | 3.5 | 0.06 | 58 | <5 mg/l | ○ |
| 6 | 20000 | The apparatus cannot be established actually | 0.06 | — | 30 mg/l | X | persulfuric acid/TOC: persulfuric ions production rate/TOC increase rate wafers, totaling 12,000 wafers), and results again showed that the high-concentration sulfuric acid solution served effectively for resist removal and that the TOC concentration decreased below the detection limit.

Comparative Example 2

In a cleaning vessel, 40 L of 98% concentrated sulfuric acid was poured and 8 L of a 35% hydrogen peroxide solution was added to produce a solution, which was then heated at 130° C. According to the same immersion cycle as in Example 1, resist-contaminated wafers were immersed in the solution to carry out dissolution of the resist. In the first 6 cycles (cleaning 300 wafers), the solution served to perform resist removal effectively, and though it became brown immediately after the start of immersion, it became colorless and transparent in nearly 10 minutes, and the TOC concentration reached the detection limit. For the next set of 50 wafers, however, resist was left on the wafers, the solution remaining brown, and the TOC concentration being still 30 mg/L in 10 minutes after the start of immersion. Thus, these 50 wafers were excluded because it was considered that they had not undergone effective treatment.

Subsequently, 8 L of the solution was taken out from the cleaning vessel, and 8 L of a hydrogen peroxide solution was added to produce a solution, which was then heated at 130° C. The wafer immersion test was continued. In the first 2 cycles (cleaning 100 wafers), the solution served to perform resist removal effectively, and though it became brown immediately after the start of immersion, it became colorless and transparent in nearly 10 minutes, and the TOC concentration reached the detection limit. For the next set of 50 wafers, however, resist was left on the wafers, the solution remaining brown, and the TOC concentration being still 30 mg/L in 10 minutes after the start of immersion. Thus, these 50 wafers were excluded because it was considered that they had not undergone effective treatment.

Then again, 8 L of the solution was taken out from the cleaning vessel and 8 L of a hydrogen peroxide solution was added. The wafer immersion test was continued, but when 50 wafers were immersed, the solution failed to remove the resist effectively, leaving some resist on the wafers after 10 minutes. Replacement of the entire solution became necessary when cleaning of a total of 400 wafers was finished. Wafers thus cleaned were placed in a wafer analyzer, where they were heated at 400° C. and the organic residue was measured with a mass spectrometer. The amount of organic residue was in the range of about 500 to 1000 $pg/cm^2$, suggesting that highly clean wafers were not obtained. Furthermore, the periphery of the pattern was observed by low acceleration voltage type scanning electron microscopy, and results showed that a large amount of resist residue was left.

Example 3-1

A high-concentration sulfuric acid solution prepared by mixing 40 L of 97% concentrated sulfuric acid and 8 L of ultrapure water was poured in a cleaning vessel and maintained at 130° C. In the electrolytic reaction apparatus, two electrolysis cells connected in series were placed, each cell containing 10 electrodes, and each electrode comprising boron-doped conductive diamond supported on a Si substrate with a diameter of 15 cm and thickness of 1 mm. The effective anode area and the current density were 30 $dm^2$ and 30 $A/dm^2$, respectively, and the electrolysis was conducted at 40° C. From the analysis of a sample of the solution flowing out from the outlet of the electrolytic reaction apparatus, it was shown that the persulfate ions production rate was 3 g/L/hr. For one immersion cycle, 50 six-inch silicon wafers coated with resist were immersed for 10 minutes in the cleaning vessel. Immersion was continued for a total of 40 hours (cleaning a total of 12,000 wafers) to perform dissolution of resist (TOC increase rate: 0.04 g/L/hr).

During this process, the sulfuric acid concentration of the sulfuric acid solution was monitored continuously with a sulfuric acid concentration measurement apparatus, and whenever the sulfuric acid concentration reaches 16.6M, ultrapure water was injected automatically until the sulfuric acid concentration reaches 16.4M.

This allowed the sulfuric acid concentration to be maintained in the range of 16.3 to 16.7M throughout the process.

Example 3-2

A high-concentration sulfuric acid solution prepared by mixing 40 L of 97% concentrated sulfuric acid and 8 L of ultrapure water was poured in a cleaning vessel and maintained at 130° C. In the electrolytic reaction apparatus, two electrolysis cells connected in series were placed, each cell containing 10 electrodes, and each electrode comprising boron-doped conductive diamond supported on a Si substrate with a diameter of 15 cm and thickness of 1 mm. The effective anode area and the current density were 30 $dm^2$ and 30 $A/dm^2$, respectively, and the electrolysis was conducted at 40° C. From the analysis of a sample of the solution flowing out from the outlet of the electrolytic reaction apparatus, it was shown that the persulfate ions production rate was 3 g/L/hr. For one immersion cycle, 50 six-inch silicon wafers coated with resist were immersed for 10 minutes in the cleaning vessel. Immersion was continued for a total of 40 hours (cleaning a total of 12,000 wafers) to perform dissolution of resist (TOC increase rate: 0.04 g/L/hr).

During this process, the liquid level of the sulfuric acid solution was monitored continuously with a level sensor provided in the cleaning vessel, and whenever the liquid level lowered by 5 mm, ultrapure water was injected automatically to raise the liquid level up to the initial height.

This allowed the sulfuric acid concentration to be maintained in the range of 16.2 to 16.7M throughout the process.

Example 3-3

A high-concentration sulfuric acid solution prepared by mixing 40 L of 97% concentrated sulfuric acid and 8 L of ultrapure water was poured in a cleaning vessel and maintained at 130° C. In the electrolytic reaction apparatus, two electrolysis cells connected in series were placed, each cell containing 10 electrodes, and each electrode comprising boron-doped conductive diamond supported on a Si substrate with a diameter of 15 cm and thickness of 1 mm. The effective anode area and the current density were 30 $dm^2$ and 30 $A/dm^2$, respectively, and the electrolysis was conducted at 40° C. From the analysis of a sample of the solution flowing out from the outlet of the electrolytic reaction apparatus, it was shown that the persulfate ions production rate was 3 g/L/hr. For one immersion cycle, 50 six-inch silicon wafers coated with resist were immersed for 10 minutes in the cleaning vessel. Immersion was continued for a total of 40 hours (cleaning a total of 12,000 wafers) to perform dissolution of resist (TOC increase rate: 0.04 g/L/hr). The whole of cleaning vessel was put on the load cell.

During this process, the total weight of the cleaning vessel was monitored continuously, and whenever the weight decreased by 0.1 kg, 0.1 kg of ultrapure water was injected automatically. This allowed the sulfuric acid concentration to be maintained in the range of 16.0 to 16.8M throughout the process.

Thus, the invention has been explained above based on practical modes and examples, but these modes or examples do not impose any limitations on the invention, and they may be modified in the scope of the invention.

INDUSTRIAL APPLICABILITY

The cleaning system of the invention is suited particularly to cleaning of silicon wafers, glass substrates for liquid crystals, photomask substrates, and other substrates for electronic materials, as well as cleaning of other various objects. More specifically, it can be used in processes for removing organic substances such as resist residue adhering to semiconductor substrates. It can be used also in processes for removing contaminants including fine particles and metal adhering to semiconductor substrates.

In most conventional semiconductor substrate processing processes, dry etching and ashing steps for oxidizing and ashing resist, which is organic material, are provided for pretreatment prior to cleaning. Use of such steps, however, can increase the equipment and processing costs. Compared with these, the system of the invention, which can perform cleaning very effectively, can achieve the removal of resist adequately in a process that does not have such pretreatment steps for dry etching and ashing. Thus, the invention can serve to establish a process that is free of such pretreatment steps.

The invention claimed is:

1. A sulfuric acid recycling system for continuously regenerating persulfuric acid from a persulfuric acid solution comprising:
    an electrolytic reaction apparatus having electrodes that include at least one anode and at least one cathode arranged in the persulfuric acid solution connected to a source of electrical power with the persulfuric acid solution adapted to flow between the electrodes for electrolyzing the solution based on a predetermined sulfuric acid concentration, such that persulfuric acid is being continuously regenerated by an electrolytic reaction which produces persulfate ions at the at least one anode from sulfate ions;
    cleaning apparatus for removing contaminants from an object to be cleaned and dissolving the contaminants by said persulfuric acid solution;
    circulation apparatus including a circulation line connected between said electrolytic reaction apparatus and said cleaning apparatus for continuously recirculating the persulfuric acid solution in said circulation line between the cleaning apparatus and the electrolytic reaction apparatus while simultaneously regenerating persulfuric acid, with the circulation line being connected to an inlet of said cleaning apparatus;
    heating means, capable of heating the solution to 100 to 170° C., located in the circulation line so as to heat the solution upstream of the cleaning apparatus so that the heated solution enters the cleaning apparatus at the temperature of between 100 to 170° C.;
    cooling means, capable of cooling the solution to 10 to 90° C., located in the circulation line so as to cool the solution upstream of the electrolytic apparatus so that the cooled solution directly enters the electrolytic apparatus at the temperature of between 10 to 90° C.;
    a solution replenishment line of either ultrapure water or hydrogen peroxide for supplying ultrapure water or hydrogen peroxide directly to the persulfuric acid solution in said system to replenish the water content in the solution that otherwise gradually decreases as a result of electrolysis of the solution and/or evaporation;
    a sulfuric acid concentration measurement unit for monitoring the sulfuric acid concentration of the solution; and,
    a control unit programmed to control the supply of ultrapure water or the hydrogen peroxide directly to the persulfuric acid solution in said system from the solution replenishment line of ultrapure water or hydrogen peroxide in direct response to the concentration of sulfuric acid measured by the sulfuric acid concentration measurement unit so as to maintain the concentration of sulfuric acid at a prescribed sulfuric acid concentration during the continuous regeneration of persulfuric acid.

2. A sulfuric acid recycling system as described in claim 1 comprising a heat exchange means to perform heat exchange in said circulation line between the persulfuric acid solution flowing from said electrolytic reaction apparatus and the persulfuric acid solution flowing from said cleaning apparatus having a higher temperature than the persulfuric acid solution flowing from said cleaning apparatus.

3. A sulfuric acid recycling system as described in claim 1 wherein said circulation line is formed of quartz or tetrafluoroethylene.

4. A sulfuric acid recycling system as described in claim 1 further comprising a decomposition unit for decomposing contaminants removed from the object by said persulfuric acid solution.

5. A sulfuric acid recycling system as described in claim 1 wherein the solution to be electrolyzed in said electrolytic reaction apparatus has a sulfuric acid concentration in the range of 8M to 18M.

6. A sulfuric acid recycling system as described in claim 1 wherein of the electrodes in the electrolytic reaction apparatus, the at least one anode is a conductive diamond electrode.

7. A sulfuric acid recycling system as described in claim 6 wherein the conductive diamond electrode provided in the electrolytic reaction apparatus is a self-standing type conductive diamond electrode produced by laminating conductive diamond on a substrate followed by removing the substrate.

8. A sulfuric acid recycling system as described in claim 1 wherein the object to be cleaned is a semiconductor substrate.

9. A sulfuric acid recycling system as described in claim 1 wherein electrolysis is controlled so that the ratio between the rate of TOC (total organic carbon) increase resulting from the removal of organic contaminants in said cleaning apparatus and the rate of persulfuric acid production in said electrolysis apparatus (persulfuric acid production rate (g/L/hr) per TOC increase rate in the cleaning apparatus (g/L/hr)) is in the range of 10 to 500.

10. A sulfuric acid recycling system as described in claim 1 wherein the cleaning apparatus includes a cleaning vessel where the object is cleaned and said ultrapure water or hydrogen peroxide replenishment line is provided to inject the ultrapure water or the hydrogen peroxide solution into the cleaning vessel in said cleaning apparatus while the persulfuric acid is being simultaneously regenerated.

11. A sulfuric acid recycling system as described in claim 1 wherein injection of the ultrapure water or hydrogen peroxide from said ultrapure water or hydrogen peroxide solution replenishment line is conducted when the concentration measured by said sulfuric acid concentration measurement means is 0.2M or more higher than a prescribed value.

12. A sulfuric acid recycling system as described in claim 1 wherein said sulfuric acid concentration measurement means is designed to use absorptiometry to measure the sulfuric acid concentration.

13. A sulfuric acid recycling system as described in either claim 1 or 10 further comprising a liquid volume measurement means to monitor the volume of the persulfuric acid solution in the cleaning apparatus for controlling the injection of said ultrapure water or hydrogen peroxide in the replenishment line responsive to the liquid volume measurement means.

14. A sulfuric acid recycling system as described in either claim 1 or 10 comprising a liquid level measurement means to monitor the liquid level of the persulfuric acid solution in the cleaning apparatus for controlling the injection of said ultrapure water or hydrogen peroxide in the replenishment line responsive to the liquid level measurement means.

15. A sulfuric acid recycling system as described in either claim 1 or 10 comprising a liquid weight measurement means to monitor the weight of the persulfuric acid in the cleaning apparatus for controlling the injection of said ultrapure water or hydrogen peroxide in the replenishment line responsive to the liquid weight measurement means.

16. A sulfuric acid recycling system as described in claim 15 wherein said liquid weight measurement means is designed to measure the weight of the cleaning apparatus including the persulfuric acid solution.

17. A sulfuric acid recycling system as described in claim 1 wherein the control unit maintains the concentration of the sulfuric acid in the persulfuric acid solution based on a measurement of the volume of the solution.

\* \* \* \* \*